(12) United States Patent
Huang

(10) Patent No.: US 7,679,753 B2
(45) Date of Patent: Mar. 16, 2010

(54) PASSIVELY BIASED FIBER-OPTIC GYROSCOPE AND CURRENT SENSOR

(76) Inventor: Hung-Chia Huang, Apt. 401, No. 39, 511 Lane, Wu-Zhong Road, Shanghai (CN) 201103

( * ) Notice: Subject to any disclaimer, the term of this patent is extended or adjusted under 35 U.S.C. 154(b) by 259 days.

(21) Appl. No.: 11/768,606

(22) Filed: Jun. 26, 2007

(65) Prior Publication Data

US 2009/0002712 A1    Jan. 1, 2009

(51) Int. Cl.
*G01C 19/72* (2006.01)
*G01B 9/02* (2006.01)

(52) U.S. Cl. ......................... 356/466; 356/483
(58) Field of Classification Search ................. 356/477, 356/483, 460, 466
See application file for complete search history.

(56) References Cited

U.S. PATENT DOCUMENTS

| | | | |
|---|---|---|---|
| 4,943,132 A | 7/1990 | Huang | |
| 4,944,590 A * | 7/1990 | Poisel et al. | 356/466 |
| 5,096,312 A | 3/1992 | Huang | |
| 5,452,394 A | 9/1995 | Huang | |
| 5,479,094 A * | 12/1995 | Esman et al. | 324/96 |
| 5,677,622 A * | 10/1997 | Clarke | 356/483 |
| 6,188,811 B1 | 2/2001 | Blake | |
| 6,229,937 B1 | 5/2001 | Nolan et al. | |
| 7,206,468 B2 | 4/2007 | Huang | |
| 7,492,977 B2 * | 2/2009 | Huang | 385/11 |

FOREIGN PATENT DOCUMENTS

| | | |
|---|---|---|
| CN | 1042242 | 5/1990 |
| CN | 1383008 | 12/2002 |
| CN | 1417601 | 5/2003 |

OTHER PUBLICATIONS

Kawachi, Fabrication of Polarization-Maintaining 3×3 Single-Mode Fibre Couplers, Electronics Letters, vol. 19, No. 19, Sep. 1983, pp. 781-782.*
Burns, Optical Fiber Rotation Sensing, Academic Press, 1994, pp. 188-195.*
Yu et al, Practical Sagnac interferometer based fibre optic current sensor, IEEE proceedings, vol. 141, No. 4, Aug. 1994, pp. 249-256.*

(Continued)

*Primary Examiner*—Patrick J Connolly
(74) *Attorney, Agent, or Firm*—Dorsey Whitney LLP

(57) ABSTRACT

Passively biased fiber-optic Sagnac interferometric sensor architecture, for gyroscope and current sensor in particular, is disclosed. One embodiment uses a 3×3 coupler entirely made of circular polarization maintaining fiber that serves as a beam splitter and meanwhile a passive bias. An alternative is to use a 3×3 hybrid coupler consisting of two linear polarization maintaining fibers and one conventional single-mode fiber, with the former two connected in a common interferometric sensor circuitry, and with the latter one cut short at both ends to form matched terminations. Still another alternative is an integral unit of Faraday rotator, whose central part is a fiber-optic magneto-optic 45° rotator, with a "zero to fast" fiber-optic quarter wave plate attached to one side, and a "fast to zero" fiber-optic quarter wave plate to the other. Advantages of passive bias are simplicity in construction, no need of manual adjustment and operational stability.

10 Claims, 7 Drawing Sheets

OTHER PUBLICATIONS

Bechtle et al, S-matrix representation of polarization dependent fibre optic couplers for the simulation of optical networks, IEEE proceedings, Fibres and Optical Passive Components, Jun. 2005, pp. 192-197.*

Huang, Hung-Chia, "Asymptotic approach to solving highly irregular problems in special fiber optics", *Surveys on Mathematics for Industry*, 2001, pp. 1-21, vol. 10, © Springer-Verlag 2001, Austria.

Huang, Hung-Chia, "Microwave Approach to Highly Irregular Fiber Optics", *A Wiley-Interscience Publication*, 26 pp., © 1998, John Wiley & Sons, Inc.

Huang, Hung-Chia, "Passive Polarization-Controlled All-Fiber Gyroscope and Other Interferometric Architectures", *Fiber and Integrated Optics*, vol. 12, pp. 21-29, © 1993 Taylor& Francis, Printed in the UK.

Huang, Hung-Chia, "Practical circular-polarization-maintaining optical fiber", *Applied Optics*, vol. 36, No. 27, Sep. 20, 1997, © 1997 Optical Society of America, pp. 6968-6975.

Huang, Hung-Chia, "Fiber-Optic analogs of bulk-optic wave plates", *Applied Optics*, vol. 36, No. 18, Jun. 20, 1997, © 1997 Optical Society of America, pp. 4241-4258.

Sheem, Sang K., "Fiber-Optic gyroscope with 3×3 directional coupler", *Appl. Phys. Lett.* 37 (10), Nov. 15, 1980, pp. 869-871.

Veeser, L.R., "Faraday Effect Current Sensing Using a Sagnac Interferometer with a 3×3 Coupler", *Proc. 7th Int. Conf. Optical Fiber Sensors* (1990), pp. 325-328.

Rochford, Kent B., "Polarization Dependence of Response Funcitons in 3 × 3 Sagnac Optical Fiber Current Sensors", *Journal of Lightwave Technology*, vol. 12, No. 8, Aug. 1994, pp. 1504-1509.

\* cited by examiner

PASSIVELY BIASED FIBER-OPTIC GYROSCOPE AND CURRENT SENSOR

FIELD OF THE INVENTION

The invention relates to fiber-optic sensors, fiber-optic inteferometric circuitry, Sagnac interferometer, gyroscope, electric sensor, magnetic field sensor, fiber-optic Sagnac interferometry, passively biased fiber-optic gyroscope, passively biased fiber-optic current sensor, 3×3 circular-polarization-maintaining fiber coupler, 3×3 hi-bi fiber coupler and fiber-optic magneto-optic Faraday rotator.

TECHNICAL BACKGROUND

Fiber-optic sensors based on Sagnac interferometric circuitry described herein refer mainly to two kinds of sensors, e.g., gyroscopic rotation-rate sensor, or gyro for short, working on the Sagnac effect, and electric current or magnetic field sensor working on the Faraday effect. The essential likeness of these two effects is that both are nonreciprocal, thus leading to the circumstance that the two relevant fields, gyroscope and current sensor, have been developed parallelly on the common basis of Sagnac inteferometric fiber-optic circuitry. As a matter of fact, the R&D and T&D (T: Technology) of current sensor is largely benefited by borrowing abundance of useful technologies from its forerunner, the gyroscope.

The past decades have witnessed admirable successes in practical applications of gyroscopic sensors employing active bias, e.g., piezoelectric phase modulator (PZT) or integrated optics chip (Y-waveguide junction). Following this pace, actively biased current sensors have also been explored for a fairly long time, but the advance of this art is less successful. One major reason for the lagging behind in the R&D of current sensor is attributive to the fact that, while an all-fiber gyro architecture can be constructed in its entirety by employing the well-developed linear PM (polarization-maintaining) fiber, or so-called hi-bi fiber, a phase-detection-based current sensor of high accuracy and long-term stability needs, at least for the part of its sensing loop, the use of circular PM fiber that is by far less developed. To emphasize the specialty of circular polarization-maintaining in contrast to linear polarization-maintaining, italic style of the word "circular" is employed here and afterwards whenever it appears in connection to such special kind of PM fiber.

Despite the said successes of actively biased fiber-optic Sagnac interferometric gyros, efforts have never been discontinued in attempting to passively bias an interferometric circuitry adaptable to either gyro or current sensor applications. Attractive aspects of passive biasing include simplicity and robustness in construction, lower noise, lower cost, easier adjustment (oftentimes no need of adjustment, with the desired system behaviors accomplished all automatically), higher accuracy and stability in long-term operation, etc.

Early attempts to realize passive biasing of fiber-optic sensors employed a 3×3 coupler made of three conventional single-mode fibers serving as a beam splitter and meanwhile a passive bias in a Sagnac interferometric fiber circuit. A major deficiency of such fiber-optic interferometric architecture is that such coupler made of single-mode fiber is not capable of maintaining the SOP (State of Polarization) of light, thus incurring instability of lightwave transmission in the circuitry comprising the coupler. A 3×3 linear hi-bi fiber coupler is capable of sensing, as well as maintaining, a gyroscopic signal. Yet, up to the time being, fabrication of 3×3 linear hi-bi fiber coupler poses a serious difficulty in the process of paralleling three sets of mirror-symmetric stress-elements in constituent linear hi-bi fibers of the coupler. A search of worldwide market information on optical fiber products shows that only a very few companies provide commercial products of 3×3 linear hi-bi fiber coupler. Laboratory use of such products from one company gave extinction ratios substantially lower than 20 dB for linear light in the coupler arms, and thus could not be acceptable for use in practical sensor applications.

Another way to passively bias a fiber-optic Sagnac interferometric sensor circuitry is to employ a nonreciprocal Faraday rotator. Complexity now arises regarding how such Faraday rotator is included in the fiber-optic sensor circuitry. Presently available fiber-optic circuitry is essentially based on linear hi-bi fiber, yet a Faraday rotator works on circular light in order to acquire a phase change for accurate phase-detection. Existing method in actual sensor circuitry is either to use a bulk-optic quarter wave plate, or a short linear hi-bi fiber section with a 45° excitation, in order to provide the required linear ⇔circular SOP transformation. However, the former method is unfavorable for the need of greatly increased structural complexity, while the latter is imperfect for the inherent length-sensitive behavior of the said linear hi-be fiber section.

It is on the said technical background that the present invention comes into being with a view to overcome the existing difficulties and complexity in present fiber-optic sensor technology using one or the other kind of the above-described passive bias. Technical particulars of the invention is given below in Summary and Detailed Description of the Invention in connection with the accompanying figure drawings.

SUMMARY OF THE INVENTION

One embodiment of the present invention discloses a 3×3 fiber-optic coupler made of three circular PM fiber sections. The kind of fiber that is circular PM is a previous invention of the present inventor. See patents: U.S. Pat. No. 5,452,394; CN 01132102.4. Laboratory data for small quantity of circular PM fiber specimen have achieved a figure of merit in circularity equal to or better than 0.95. A unique and very attractive advantage of the said 3×3 circular PM fiber coupler is the ease of fabrication, completely eliminating the need of principal-axes paralleling as otherwise required in making a 3×3 linear hi-bi fiber coupler.

An utmostly simple and practical Sagnac interferometric sensor architecture is disclosed in the invention, employing a 3×3 circular PM fiber coupler to serve as a beam splitter and meanwhile as a passive means to bias the sensor circuitry. The sensing fiber loop made also of circular PM fiber is feasible inasmuch as such fiber loop is capable of sensing and maintaining its circular SOP of light in both electric current sensor and gyroscope applications.

As an alternative, the invention also discloses a 3×3 hybrid fiber coupler consisting of two linear hi-bi fibers and one conventional single-mode fiber. The two linear hi-bi fiber arms of the said coupler are connected to relevant linear hi-bi fibers in a Sagnac interferometric circuitry essentially based on linear hi-bi fiber elements and devices, while the single-mode fiber of the said coupler is cut short at an oblique angle at both ends to form matched terminals. This short "idle-looking" single-mode fiber plays the role of providing the desired 120° phase relation for the response functions, and hence a passive bias for the sensor architecture. Fabrication of the said special 3×3 hybrid fiber coupler is greatly eased inasmuch as only the two constituent linear hi-bi fibers need a paralleling process for the two sets of principal-axes referring to the mirror-symmetrical stress-elements in the respective hi-bi fibers.

Another alternative embodiment of the invention is an integral unit of fiber-optic magneto-optic Faraday rotator in conjunction with a "zero to fast" quarter wave plate at one side and a "fast to zero" quarter wave plate at the other side. See patents: U.S. Pat. No. 4,943,132; 5,096,312; 7,206,468; CN 01112680.9 for details of fiber-optic wave plates invented earlier by the present inventor. Laboratory data for prototype specimens of such integral unit have achieved near 30 dB extinction ratios at both ends and over 0.95 circularity for circular light traversing the middle fiber-optic magneto-optic Faraday rotator. The use of fiber-optic analogs of quarter wave plates is highly preferable in view of the otherwise complexity and liable inaccuracy introduced by using bulk-optic quarter wave plates or the length-sensitive linear hi-bi fiber sections to serve the functions of "linear to circular" and "circular to linear" SOP transformations.

BRIEF DESCRIPTION OF THE DRAWINGS

The present invention will become more fully understood from the detailed description given herein below and the accompanying drawings which are given by way of illustration only, and thus, are not limitative of the present invention, and wherein.

DETAILED DESCRIPTION OF THE INVENTION

Figure 1:
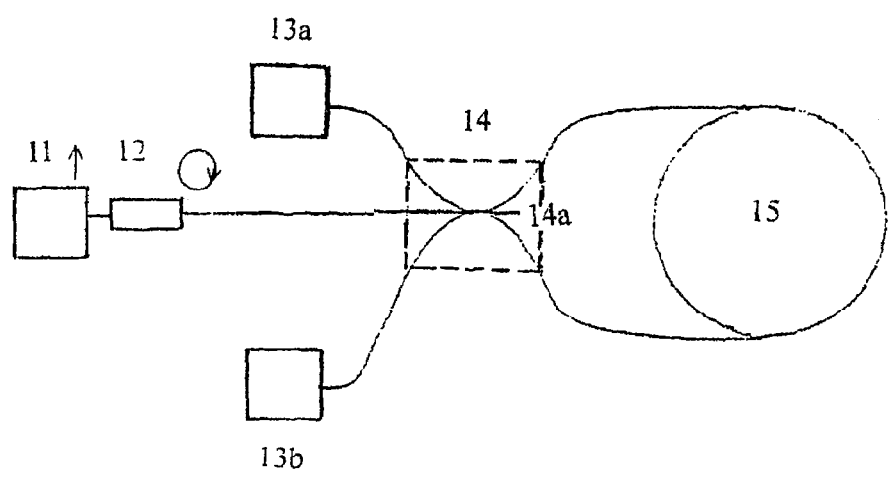
FIG. 1 is a schematic diagram of a fiber-optic interferometric sensor architecture, with linear light from the source converted via a "fiber-optic quarter wave plate" into circular light to feed the fiber circuitry, and with a 3×3 circular PM fiber coupler serving as beam splitter and meanwhile as passive bias for this fiber circuitry.

One embodiment of the invention is an all-circular PM fiber-optic sensor architecture that is passively biased with the aid of a 3×3 circular PM fiber coupler, as shown in FIG. 1.

Figure 2A:
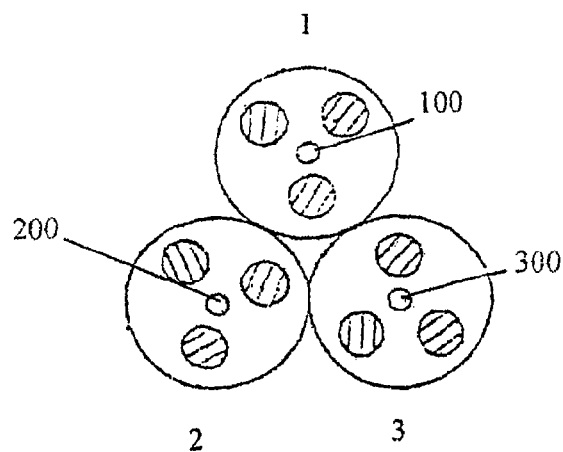
FIG. 2a is a cross-section of the invented 3×3 circular PM fiber coupler consisting of three circular PM fibers, whose cores are positioned symmetrically to form the geometry of a triangle.

A cross-sectional view of one version of the said 3×3 circular PM fiber coupler is schematically drawn in FIG. 2a. For detailed technical description of circular PM fiber, see patents: U.S. Pat. No. 5,452,394 and CN 88107389.X issued to Hung-chia Huang. In the figure, numerals 1, 2, 3 mark cross-sections of the three constituent circular PM fibers of the said coupler; numerals 100, 200, 300 are the cores of the respective fibers; the three dashed circles surrounding each core represents a set of stress-elements responsible to the circular birefringence generated in the course of fabrication by spinning the fiber, and hence the stress-elements, during the linear draw. The three fiber cores are positioned symmetrically on a cross-sectional plane, showing a transverse triangular geometry.

Figure 6A:
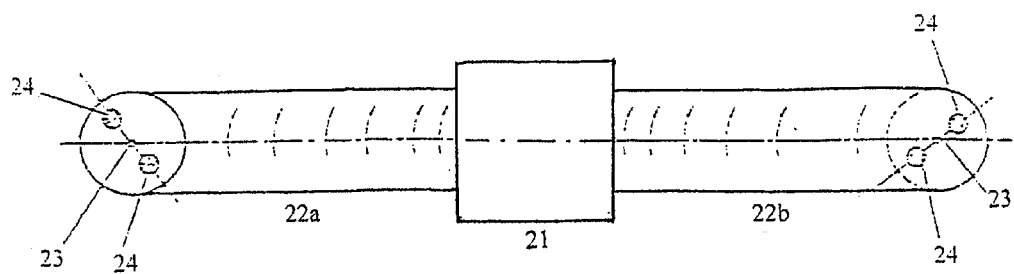
FIG. 6a is a schematic drawing of an integral unit of Faraday rotator, whose central section is a fiber-optic magneto-optic rotator performing a nonreciprocal 45° rotation, with a "zero to fast" and a "fast to zero" fiber-optic quarter wave plates attached to both sides of the integral unit.
Figure 6B:
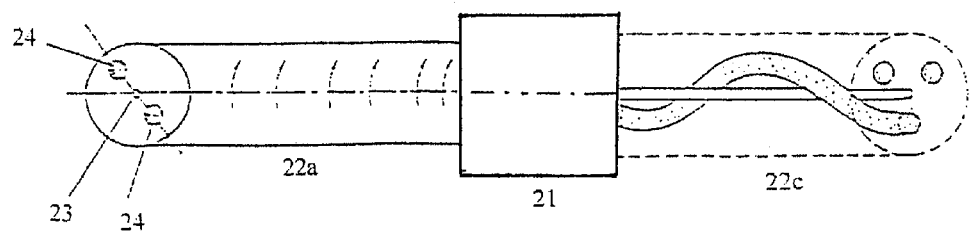
FIG. 6b is a schematic drawing of an integral unit of Faraday rotator, whose central section is a fiber-optic magneto-optic rotator performing a nonreciprocal 45° rotation, with a "zero to fast" fiber-optic quarter wave plate attached to one side, and a circular PM fiber to the other.
Figure 6C:
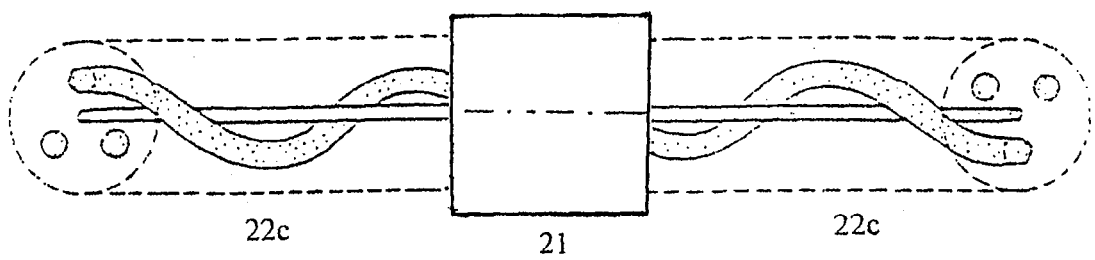
FIG. 6c is a schematic drawing of an integral unit of Faraday rotator, whose central section is a fiber-optic magneto-optic rotator performing a nonreciprocal 45° rotation, with two circular PM fibers attached to both sides of the integral unit.

In the longitudinal or axial or transmission direction, each stress-element traces a curve in the form of a spiral around the fiber axis (not shown in FIG. 2a; see the right side of FIG. 6b and the two sides of FIG. 6c). For 3×3 circular PM fiber coupler, unlike the case of 3×3 linear hi-bi fiber coupler, only "cores paralleling" is required in the process of fabrication.

In each circular PM fiber of the said coupler, the three stress-elements are so positioned that they form an equilateral triangle, and the three circular PM fibers are closely bundled as shown in FIG. 2a. Note that the cross-sectional orientations of the three equilateral triangles, each being formed by a set of three stress-elements, are entirely arbitrary with respect to one another. This non-restrictive feature of "stress-elements placement" in each circular PM fiber is a significant advantage that makes the 3×3 circular PM fiber coupler most attractive. Fabrication of such fiber couplers will not require the otherwise formidable process of aligning a multitude of the stress-elements. This feature is also advantageous in splicing the fiber arms of such coupler to circular PM fibers of other fiber devices in an interferometric sensor circuitry since only alignment of the cores is required.

Figure 2B:
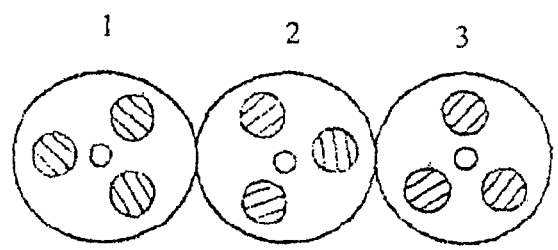
FIG. 2b is a cross-section of the invented 3×3 circular PM fiber coupler consisting of three circular PM fibers, whose cores are positioned along a straight line.

FIG. 2b shows an alternative configuration of the 3×3 circular PM fiber coupler, with the three constituent fibers positioned on the same plane, or with the three cores lying on a straight line. Like the case of FIG. 2a with triangular geometry of the cores, the present coupler construction of "straight-line" geometry simply requires paralleling of cores, without need of taking care of the cross-sectional layout of the sets of stress-elements. The "straight line" configuration shown in FIG. 2b is even simpler in fabrication since it requires a simpler flat chuck to hold the three constituent fibers of the 3×3 circular PM fiber coupler. On the other hand, for the coupler construction shown in FIG. 2b, circular light on the source side preferably excites the central circular PM fiber to achieve balanced divisions of light power in the two circular PM fibers on both sides.

The 3×3 circular PM fiber coupler, marked 14 in FIG. 1, is central to the concerned fiber-optic all-circular-light Sagnac interferometric sensor circuitry, playing the role of a circular-light beam splitter and meanwhile a device to provide a passive bias of this circular-light circuitry. Numeral 11 in FIG. 1 is a light source delivering a linear light which, with the aid of a "zero to fast" fiber-optic quarter wave plate 12 (patents: U.S. Pat. No. 7,206,468: CN 01112680.9), is converted to a circular light to feed the entire fiber-optic all-circular-light circuitry. It goes without saying that the "zero-spun" (i.e., unspun) end of the fiber-optic quarter wave plate 12 may be firmly joined with the linear-light source 11, so that the integral unit comprising 11 and 12 functions as a specific source that delivers a circular light.

The central arm of the 3×3 circular PM fiber coupler 14 receives circular light from "fast-spun" end of the said fiber-optic quarter wave plate 12. This circular-light beam is splitted into three circular-light beams. One beam goes straight to the other end 14a (a matched termination, as said) of the central arm, with its power dissipated therein. The two circular-light beams in the side fiber arms then enter the two terminals of the circular PM fiber sensing loop 15 and traverse clockwise and counter-clockwise through the loop to emerge from alternate terminals of 15. These two backward circular-light beams carrying the signal are recombined and interfered through the coupling region of the 3×3 circular PM fiber coupler, delivering light powers $P_1$ and $P_2$ of the interfered circular light beams to be detected by the balanced detectors 13a and 13b to yield the measured signal power via the familiar signal processing for $(P_1-P_2)/(P_1+P_2)$. The operating point lies near the position of sharpest slope, providing similar sensitivity and dynamic range as a conventional fiber-optic Sagnac interferometric sensor employing one or the other kind of active bias.

The passively biased interferometric sensor architecture shown in FIG. 1 works equally well for both current sensing and gyro. In the case of current sensing application that depends on the Faraday effect, the circular PM fiber loop is uniquely perfect to sense and further, to maintain, the sensed phase-change signal carried by circular light. Eigenmodes of the circular PM fiber (patents: U.S. Pat. No. 5,452,394: CN 88107389.X) are circular light of both senses (right and left). Consider one propagating light beam (clockwise or counter-clockwise) traversing the circular PM fiber loop, the transverse field pattern or SOP (state of polarization) of this circular eigenmode will be maintained in the entire course of transmission. What changes is only the phase of this circular eigenmode. Coupled-mode solution yields (see Huang Hung-chia, Microwave Approach to Highly Irregular Fiber Optics, Wiley InterScience, 1998, p. 159):

$$E(0) = \frac{1}{\sqrt{2}}\begin{bmatrix}1\\j\end{bmatrix}e^{j\varphi_0},\ E(L) = \frac{1}{\sqrt{2}}\begin{bmatrix}1\\j\end{bmatrix}e^{j(\varphi_0+\varphi_g+\varphi_F)},\ \varphi_F = V(AT)$$

where $\phi_0$ represents an initial phase; $\phi_g$, phase change due to the waveguiding effect of the circular PM fiber; and $\phi_F$, phase change due to the Faraday effect, where (AT) is the ampere turns that produces the overall magnetic field, and V is the Verdet constant. Here, it is important to note that the waveguiding phase change $\phi_g$ is a reciprocal process, whereas the phase change due to the Faraday effect is a nonreciprocal process, such that through a two-way (to and fro) travel the reciprocal phase change in one way will cancel that in the other way, but the nonreciprocal Faraday-effect phase change will be doubled to become 2V(AT).

In the case of a gyro working on the Sagnac effect, presently existing fiber-optic inteferometric sensor employs linear PM fiber (so-called hi-bi fiber) exclusively for the entire optical circuitry, including the sensing fiber loop. Linear hi-bi fiber of any version supports either of the two principal-axes aligned linear eigenmodes. A coiled fiber loop employing linear hi-bi fiber that is fed with a principal-axis aligned linear light is capable of sensing a Sagnac-effect phase change, and further, to maintain this sensed phase change. A phenomenological description of the Sagnac effect is to say that a rotation of the fiber loop effectively shortens the path of one propagating light beam in comparison to the path of the other beam. A rotation of the fiber loop will not affect the linear SOP of the propagating light, and what changes is only its phase.

The invented sensor circuitry shown in FIG. 1 that is entirely made of circular PM fiber supporting a circular eigenmode works in gyro application just as well as a conventional hi-bi fiber sensor circuitry supporting a linear eigenmode does. A rotation of the circular PM fiber loop will not affect the circular SOP of the propagating light; and what changes is only its phase.

The said two kinds of gyro, one working on linear light in hi-bi fiber and the other working on circular light in circular PM fiber, can be described below in a phenomenological way:

$$E(0) = \begin{bmatrix}1\\0\end{bmatrix}e^{j\Psi_0},\ E(L) = \begin{bmatrix}1\\0\end{bmatrix}e^{j(\Psi_0+\Psi_g+\Psi_S)}$$

$$E(0) = \frac{1}{\sqrt{2}}\begin{bmatrix}1\\j\end{bmatrix}e^{j\Psi_0},\ E(L) = \frac{1}{\sqrt{2}}\begin{bmatrix}1\\j\end{bmatrix}e^{j(\Psi_0+\Psi_g+\Psi_S)}$$

where the first and second lines refer, respectively, to the cases of linear and circular eigenmode transmission, wherein the SOP in either case is maintained and what changes is the phase only. (In the equations, $\psi_0$, $\psi_g$ and $\psi_S$ denote initial phase, waveguiding phase-change and phase change due to the Sagnac effect, respectively.) The Sagnac effect is likewise a nonreciprocal process, such that previous description of the fundamental difference between reciprocal and nonreciprocal phase changes applies here to the Sagnac effect as well. With reference to FIG. 1, the overall Sagnac phase shift measured by the balanced detectors is given by $[2\pi LD/(\lambda c)]\Omega$, where L is length of fiber; D, diameter of loop; $\lambda$, free-space wavelength; c, free-space velocity of light; and $\Omega$, the gyro-sensed rotational rate.

A view of FIG. 1 shows that the present invention is most attractive from the viewpoint of "integrated fiber optics" in that its entire fiber-optic circuitry can be constructed via two circular PM fiber sections. One is a short section to serve as the central arm of the 3×3 circular PM fiber coupler, with one end core-to-core spliced to the "fast-spun" end of the fiber-optic quarter wave plate 12 (without need of stress-elements aligning), and with the other end left idle in the form of a matched terminal via an oblique cutting (usually >10°, up to 45° or even larger). The other section is a long circular PM fiber, whose total length includes the lengths of the two side arms of the 3×3 circular PM fiber coupler and, in addition, the length of the entire coiled fiber loop for sensing. The central or main portion of this long section of circular PM fiber is coiled in the form of a loop, with its two "tails" (each about one meter or some decimeters long) left over which in a next step are processed in corporation with the said short section of circular PM fiber to make a 3×3 circular PM fiber coupler by employing the well-established fabrication technique, i.e., "closing-up, heating, melting and streching", requiring "core to core" paralleling only. Thus, the three parts, i.e., the two side fiber arms of coupler plus the whole coiled fiber loop, can be integrated together without a splice or junction. Obviously, the making of an essentially jointless Sagnac interferometric architecture for gyro or electric current sensing would not be possible if without the availability of the previously invented circular PM fiber.

Recent progress in laboratory in fabricating circular PM fiber (patents: U.S. Pat. No. 5,452,394; CN 88107389.X; CN 01132102.4) has achieved small quantity of such fiber capable of maintaining a circular light with circularity higher than 0.95, thus promising the practicality of the use of the all-circular SOP fiber-optic circuitry shown in FIG. 1 as an inteferometric sensor architecture both for electric current and gyroscopic (rotational rate) sensing. It is believed that this said architecture potentially represents the utmostly simple, robust, and low-cost construction for electric current and gyro applications.

The said all circular-light sensor architecture is potentially most promising. At the same time, however, a sensor architecture essentially based on linear hi-bi fiber technology can never be ignored in view of the fact that this technology is by far more mature in element-device making and circuitry construction. Regarding a 3×3 linear hi-bi fiber coupler, it was said in the foregoing text that fabrication of such coupler, which involves the process of paralleling not only of the three cores, but also of the three pairs of mirror-symmetrical stress-elements, poses a task too difficult to be practical, with the result that the very few market-available products of the said kind of coupler hardly achieve an extinction ratio for coupled linear lightwaves higher than 20 dB. In view of this state-of-the-art, an alternative version of 3×3 hybrid fiber coupler is disclosed that consists of two linear hi-bi fibers incorporated with one single-mode fiber, as shown in FIGS. 3a, 3b and 4.

Figure 3B:
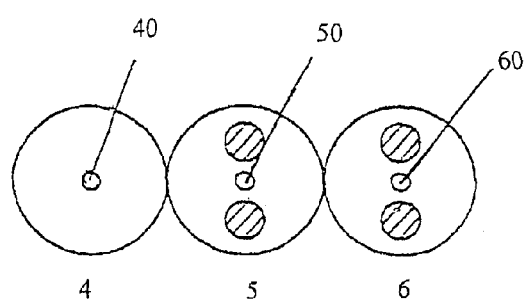
FIG. 3b is the cross-section of FIG. 3a, showing that the three fiber cores are positioned along a line, with the two pairs of slow-axes of linear hi-bi fibers aligned in parallel.
Figure 3A:
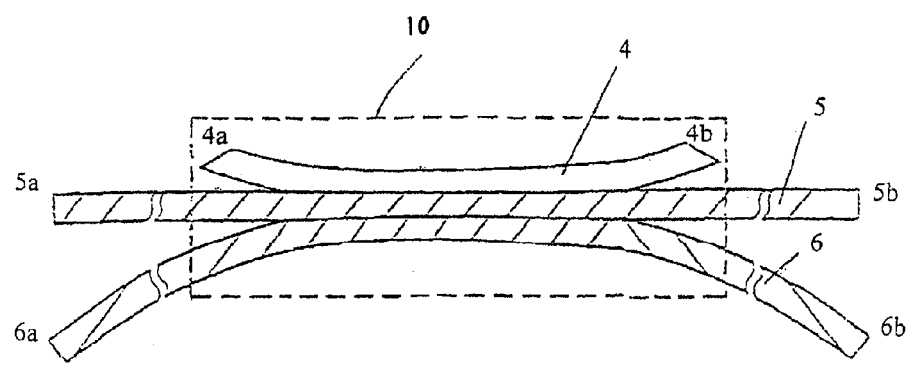
FIG. 3a is a side view of a 3×3 hybrid fiber coupler, in which a single-mode fiber is placed on either side of two adjacent linear hi-bi fibers, and is cut short at both ends at an oblique angle to form two matched terminations, such that only the two adjacent linear hi-bi fibers are to be spliced into the interferometric fiber circuitry.

FIG. 3a shows the side view of one version of the said hybrid fiber coupler, in which numeral 4 is a section of single-mode fiber and numerals 5 and 6 are sections of linear hi-bi fibers, with the latter two shaded in the figure to make a difference. For each fiber, a and b attached to a numeral denote the two ends of this fiber. Note that the single-mode fiber is cut short at both ends with the cutting angle $\geq 10°$ to form matched terminals. This single-mode fiber section may be short enough and placed entirely inside the capsule 10 of the fabricated coupler such that the outside appearance of the fiber device becomes a 2×2 hi-bi fiber coupler. Otherwise, the said single-mode fiber section may be allowed to be slightly longer so as to provide two tails outside the coupler-capsule for use, for example, in connection with light power monitoring. In this case, the single-mode fiber tails outside the capsuled hybrid fiber coupler should be firmly fixed up in position inasmuch as single-mode fiber cannot resist exterior perturbations.

A transverse cross-sectional view, accompanying the side view given by FIG. 3a, of the said hybrid fiber coupler is shown in FIG. 3b, in which the three fibers 4, 5 and 6 are placed on the same plane such that their cores 40, 50 and 60 lie on a straight line. Such placement of the three fibers simplifies construction of the chuck to hold the fibers during the fabrication process. Note that in FIG. 3b, the single-mode fiber is not placed symmetrically in-between the two linear hi-bi fibers, but is placed on one or the other side of the two adjacent linear hi-bi fibers. The reason for such placement of the single-mode fiber is simply to ensure efficient power transfer between the two linear hi-bi fibers.

Figure 4:
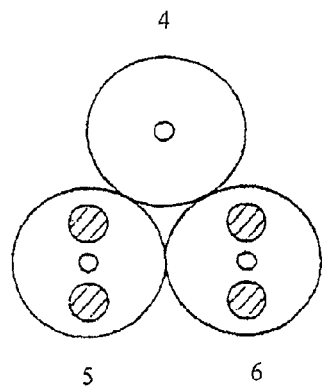
FIG. 4 is a cross-section of a 3×3 hybrid fiber coupler made of one single-mode fiber and two linear hi-bi fibers, with the three fiber cores equally spaced to form a triangle, and with the two pairs of slow-axes of linear hi-bi fibers aligned in parallel.

FIG. 4 shows the transverse geometry of a 3×3 hybrid fiber coupler in which the single-mode fiber 4 is symmetrically placed with respect to the two linear hi-bi fibers 5 and 6, such that the three fiber cores form a triangle. In fabricating 3×3 hybrid fiber coupler, all three cores need to be paralleled, but the task of "stress-elements paralleling" is required only for the two linear hi-bi fibers, thereby greatly simplifying the fabrication process, which would be prohibitively more complex in the case of 3×3 hi-bi fiber coupler requiring paralleling of three pairs of stress-elements. Side view of the structure relating to FIG. 4 is not shown, with the understanding that specifications for the single-mode fiber section in FIG. 3b apply also for its alternative FIG. 4.

Figure 5:
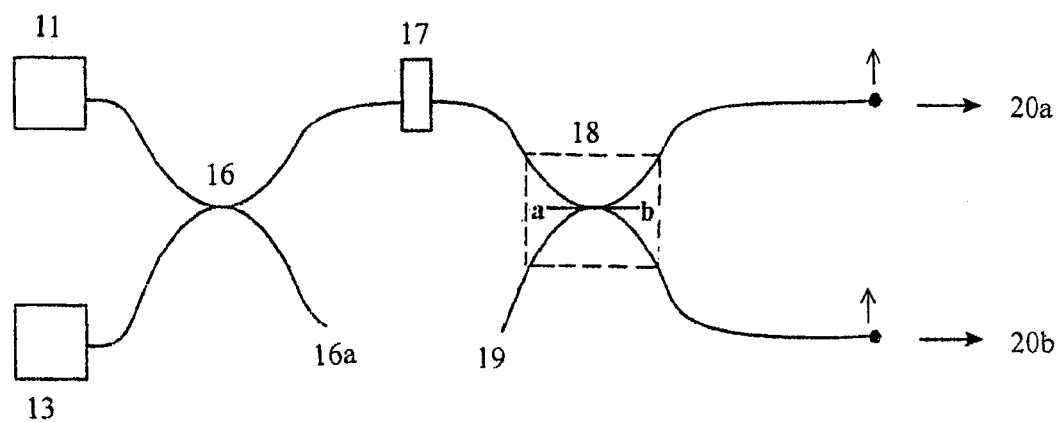
FIG. 5 is a schematic diagram of a fiber-optic interferometric circuitry, with a linear source feeding the circuitry, and a 3×3 hybrid fiber coupler serving as beam splitter and meanwhile as passive bias for this fiber circuitry.

An interferometric sensor architecture based on linear hi-bi fiber circuitry is shown in FIG. 5. Central to this circuitry is the special hybrid fiber coupler having been described in connection with FIGS. 3a, 3b, and 4. A principal-axis aligned linear light feeding one side arm of the capsuled hybrid fiber coupler 18 is provided by the source 11 via a single-mode fiber coupler 16 and a polarizer 17. The hybrid fiber coupler splits the incoming linear light beam into three linear light beams. Thus, one beam of light in the single-mode fiber arm goes straight forward to the matched terminal b with its power dissipated therein. Any returned light in this arm is dissipated in the other matched terminal a. Meanwhile, the other two beams coupled to the linear hi-bi fiber arms of the said hybrid coupler go straight forward to enter the two terminals of the sensing fiber loop, as shown by the arrows 20a and 20b, and traverse clockwise and counter-clockwise, respectively, around the loop. This coiled fiber loop is made of linear hi-bi fiber in gyro application; but otherwise in electric current sensor application, it is made of circular PM fiber whose terminals are spliced to the side arms of the said hybrid fiber coupler via two fiber-optic quarter wave plates (not shown). After traversing the fiber loop, the two linear light beams come back in the directions opposite to those of the arrows 20a and 20b, and then recombined and interfered through the coupling region of the hybrid fiber coupler. The returned light carrying the sensed signal is finally detected by the detector connected to 19. The numeral 16a is a matched termination, whereas the numeral 13 may be either a matched termination, or connected with one more detector for power monitoring.

Referring again to the hybrid fiber coupler in FIG. 5, it is seen that the short single-mode fiber looks "idle" in the interferometric fiber circuitry. Yet this "idle" piece of single-mode fiber actually plays the role of providing the desired 120°-relation that is indispensable for realizing a passive bias in the fiber-optic interferometric architecture.

The said two embodiments of the invention are featured by employing two types of fiber-optic 3×3 coupler, each acting as a beam splitter and meanwhile a passive bias. A third embodiment of the invention to be disclosed below is featured by the use of a separate unit to passively bias a fiber-optic sensor circuitry, with the aid of a conventional 2×2 hi-bi coupler to function as a prior beam splitter. The said passive bias unit consists of two fiber-optic quarter wave plates (see patents: U.S. Pat. No. 7,206,468; CN 01112680.9) attached to a fiber-optic 45° Faraday rotator. Laboratory specimens of small quantity of such integral unit achieve a figure of merit near 30 dB extinction ratio for linear light at the ends and meanwhile a figure of merit better than 0.95 circularity for circular light in the middle. One specimen is schematically drawn in FIG. 6a, in which the central section 21 is a fiber-optic 45° Faraday rotator, and the numerals 22a and 22b are "zero to fast" and "fast to zero" fiber-optic quarter wave plates, respectively. The numeral 23 is core of fiber; and the numeral 24 is stress-element. A principal-axis aligned linear light enters the "zero-spun" or unspun end of the first fiber-optic quarter wave plate 22a, and is transformed to a circular light at the other "fast-spun" end of this wave plate. The transformed circular light then enters and traverses the fiber-optic rotator with a nonreciprocal phase change of 45°. The emerging circular light from the rotator then enters the second fiber-optic quarter wave plate 22b at its fast-spun end, and is transformed by this wave plate to become a principal-axis aligned linear light again. Apparently, the said integral unit is adaptable to a conventional inteferometric circuitry that is structured essentially on the basis of linear hi-bi fiber. An inclusion of such an integral unit into a linear hi-bi fiber circuitry requires a technique no more than the standard hi-bi fiber splicing.

Shown in FIGS. 6b and 6c are alternative versions of the said integral Faraday rotator unit. FIG. 6b is one version, in which one side of the central rotator 21 is a fiber-optic quarter wave plate 22a and the other side is a circular PM fiber 22c. An integral Faraday rotator unit of this kind is adequate to inclusion in a fiber-optic interferometric circuitry wherein one end of the rotator needs to be spliced to a linear hi-bi fiber element or device, whereas the other end of the rotator needs to be spliced to a circular PM fiber element or device. FIG. 6c is another version, in which two sections of circular PM fiber 22c are employed in corporation with the central 45° Faraday rotator. This version is obviously adaptable to an interferometric fiber-optic circuitry that is essentially structured on the basis of circular PM fiber.

Figure 7:
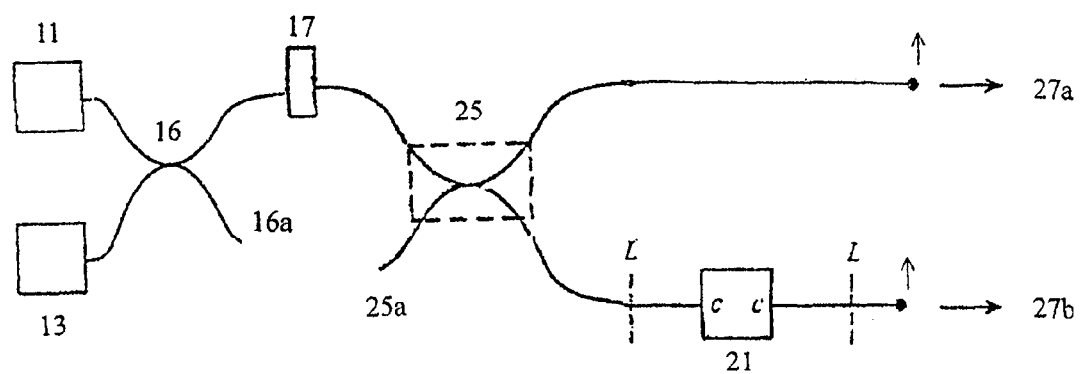
FIG. 7 is a schematic diagram of a passively biased sensor architecture employing the integral unit of Faraday rotator shown in FIG. 6a to function as the passive bias.

A typical application example is shown in FIG. 7. Comparing FIG. 7 with FIG. 5 reveals that the two inteferometric architectures shown in these two figures are closely alike on the side of source and the side of coiled fiber loop. A major difference exists, however, in the central parts of these two architectures. Thus, the special hybrid fiber coupler in FIG. 5 functions as a beam splitter and meanwhile provides the 120° phase relation for a passive bias of the interferometric circuitry. On the other hand, referring to FIG. 7 shows that in this figure the beam-splitting and the passive biasing are performed separately with the aid of the 2×2 linear hi-bi fiber coupler 25 and the integral 45° Faraday rotator unit 21, respectively.

In FIG. 7, the numeral 25a may be a matched terminal, or connected to one more detector for enhanced sensitivity and dynamic range in a two-channel detection. The two letters c and c on two sides of the central fiber-optic rotator indicate that circular light passes this central rotator with a phase change of 45°. The two capital letters L and L on top of the vertical dashed lines indicate that linear light beams appear on both sides of the integral Faraday rotator unit that is a part of the interferometric circuitry essentially based on linear hi-bi fiber.

On the right side of FIG. 7, the two horizontal arrows 27a and 27b indicate placement of the coiled sensing fiber loop (not shown). The previous description of such loop in FIG. 5 applies here also for FIG. 7, i.e., in gyro application the loop is made of linear hi-bi fiber, whereas in current sensor application the loop is made of circular PM fiber whose terminals are spliced to two fiber-optic quarter wave plates to convert two counter-propagating circular light beams in the loop to linear light beams as shown by the two vertical arrows in the figure.

Figure 8:
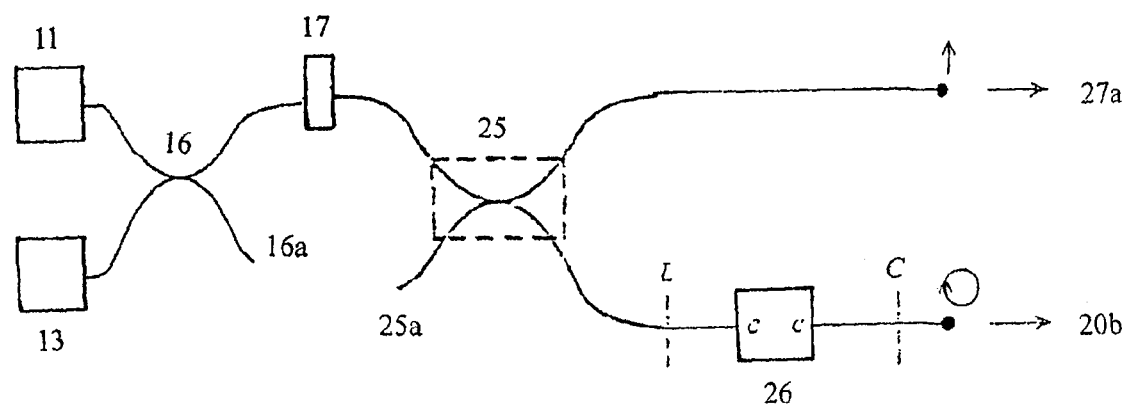
FIG. 8 is a schematic diagram of a passively biased sensor architecture employing the integral unit of Faraday rotator shown in FIG. 6b to function as the passive bias.

An alternative version of passively biased sensor circuitry is shown in FIG. 8, employing an integral Faraday rotator unit 26 whose overall structure is drawn in FIG. 6b. Comparing FIG. 8 and FIG. 7 shows that the difference between these two architectures is only in the SOP of the emerging light from the integral rotator unit. For FIG. 8, the SOP of the said emerging light is circular, as indicated by the capital letter C, such that terminal 20b of the rotator unit can be spliced directly to one terminal of the circular PM fiber loop, dispensing with the need for a "fast to zero" fiber-optic quarter wave plate for an SOP transformation.

Given below is a succinct mathematical description of the inherent SOP transmission and conversion characteristics of the said integral 45° nonreciprocal Faraday rotator unit. The central section of the unit is a fiber-optic passive Faraday rotator, whose function is described by a rotation-matrix of the following form:

$$R = \begin{bmatrix} \cos\vartheta & \sin\vartheta \\ -\sin\vartheta & \cos\vartheta \end{bmatrix}$$

where θ is angle of rotation of the rotator, and can be (+) or (−), with one denoting clockwise rotation, and the other, counter-clockwise rotation. Matrix expressions for x- and y-aligned linear light are:

$$E_l = \begin{bmatrix} 1 \\ 0 \end{bmatrix} e^{j\vartheta_0}, \begin{bmatrix} 0 \\ 1 \end{bmatrix} e^{j\vartheta_0}$$

and those for circular light are:

$$E_c = \frac{1}{\sqrt{2}} \begin{bmatrix} 1 \\ \pm j \end{bmatrix} e^{j\vartheta_0}$$

where $\theta_0$ is initial phase of light; and ± refer to right and left handedness of circular light.

A principal-axis (say, x) aligned linear light traversing a Faraday rotator becomes:

$$RE_l = \begin{bmatrix} \cos\vartheta & -\sin\vartheta \\ \sin\vartheta & \cos\vartheta \end{bmatrix} \begin{bmatrix} 1 \\ 0 \end{bmatrix} e^{j\vartheta_0} = \begin{bmatrix} \cos\vartheta \\ \sin\vartheta \end{bmatrix} e^{j\vartheta_0}$$

which displays descriptive of the fact that linear light traversing a Faraday rotator maintains its linear SOP without change of phase, and what changes is only its orientation by an angle θ called the Faraday rotation angle.

A circular light of one (say, right) handedness traversing a Faraday rotator becomes:

$$RE_c = \frac{1}{\sqrt{2}} \begin{bmatrix} \cos\vartheta & \sin\vartheta \\ -\sin\vartheta & \cos\vartheta \end{bmatrix} \begin{bmatrix} 1 \\ j \end{bmatrix} e^{j\vartheta_0} = \frac{1}{\sqrt{2}} \begin{bmatrix} 1 \\ j \end{bmatrix} e^{j(\vartheta_0 + \vartheta)}$$

which also displays the fact that circular light traversing a Faraday rotator maintains its circular SOP throughout, only with a change of its phase due to the Faraday effect.

Consider the integral unit shown in FIG. 6a, which includes a fiber-optic "zero to fast" and a "fast to zero" quarter wave plates joined at the two sides of a fiber-optic 45° Faraday rotator. Given below are the transfer-matrix expressions of fiber-optic quarter wave plates (see Huang Hung-chia, Microwave Approach to Highly Irregular Fiber Optics, Wiley InterScience 1998, p. 246):

$$T = \frac{1}{\sqrt{2}} \begin{bmatrix} e^{j\rho} & -je^{\mp j\rho} \\ -je^{\pm j\rho} & e^{-j\rho} \end{bmatrix}$$

where the structural parameter $$\rho = \int_0^L \pi[1 + 4(L_b/L_s)^2]^{1/2} dz$$

is a function of the beat-length $L_b$, the spin pitch $L_s$ and the total length L; the upper and lower signs of $\mp$ and $\pm$ refer, respectively, to fiber-optic "zero to fast" and "fast to zero" quarter wave plates.

A principal-axis (say, x) aligned linear light traversing the said integral unit becomes:

$$T_2 R T_1 E_l = \frac{1}{\sqrt{2}} \begin{bmatrix} e^{j\rho_2} & -je^{j\rho_2} \\ -je^{-j\rho_2} & e^{-j\rho_2} \end{bmatrix} \begin{bmatrix} 1 & 1 \\ -1 & 1 \end{bmatrix} \begin{bmatrix} e^{j\rho_1} & -j^{-j\rho_1} \\ -je^{j\rho_1} & e^{-j\rho_1} \end{bmatrix} \begin{bmatrix} 1 \\ 0 \end{bmatrix}$$

$$e^{j\vartheta_0} = \begin{bmatrix} 1 \\ 0 \end{bmatrix} e^{j[\vartheta_0 + (\rho_1 + \rho_2) + 45^0]}$$

where $T_1$, $T_2$ are transfer matrices of the "zero to fast" and "fast to zero" quarter wave plates; R is a Faraday rotator with $\theta = 45°$; $E_l$ is the input x-aligned linear light with an initial phase $\theta_0$; $(\rho_1 + \rho_2)$ is the phase change of linear light due to waveguiding effect of the two fiber-optic quarter wave plates; and finally the 45° is phase change of the Faraday rotator. It is fundamentally important to notice here that the waveguiding effect phase change is a reciprocal process, whereas the Faraday effect phase change is a nonreciprocal process; such that in a "to and fro" two-way travel the two phase changes due to waveguiding effect are cancelled, but the net phase change due to Faraday effect is doubled. As a consequence, the said integral Faraday rotator unit serves the purpose to provide an optimum 90° passive bias in a Sagnac interferometric fiber-optic circuitry.

The SOP behavior of another integral Faraday rotator unit as shown in FIG. 6b can be similarly derived below:

$$e^{j\rho_c} R T_1 E_l =$$

$$\frac{e^{j\rho_c}}{\sqrt{2}} \begin{bmatrix} 1 & 1 \\ -1 & 1 \end{bmatrix} \begin{bmatrix} e^{j\rho} & -j^{-j\rho} \\ -je^{j\rho} & e^{-j\rho} \end{bmatrix} \begin{bmatrix} 1 \\ 0 \end{bmatrix} e^{j\vartheta_0} = \frac{1}{\sqrt{2}} \begin{bmatrix} 1 \\ j \end{bmatrix} e^{j[\vartheta_0 + (\rho + \rho_c) + 45^0]}$$

where ρ is structural parameter of the fiber-optic quarter wave plate fed by an x-aligned linear light at its input; $\rho_c$ is the overall phase change of circular light through the circular PM fiber section at the output; and the rest of the symbols bear the same meanings as those previously described in connection with the construction shown in FIG. 6a. The above equations referring to the construction shown in FIG. 6b describes a passive bias integral unit with its input end matching a linear hi-bi fiber such as one arm of a linear hi-bi fiber coupler, and with its output end matching one terminal of a coiled circular PM fiber loop employed in electric current sensor application. For a fiber-optic Sagnac interferometric circuitry passively biased by the integral unit of FIG. 6b, the coiled circular PM fiber loop in FIG. 8 needs one fiber-optic quarter wave plate only.

The invention being thus described, it will be obvious that the same may be varied in many ways. Such variations are not to be regarded a departure from the spirit and scope of the invention, and all such modifications as would be obvious to one skilled in the art are intended to be included within the scope of the following claims.

What is claimed is:

1. A passively biased fiber-optic sensor, comprising:
   a source delivering a linear light;
   a "zero to fast" fiber-optic quarter wave plate to convert the linear light to a circular light;
   a 3×3 circular PM (Polarization Maintaining) fiber coupler which serves as a beam splitter and meanwhile a passive bias with a first end of a central arm receiving the circular light, and with a second end of the central arm cut short as a matched termination;
   a sensing fiber loop whose two terminals are connected to two terminals of side fiber arms of the 3×3 circular PM fiber coupler; and
   a pair of detectors connected to another two terminals of the side fiber arms of the 3×3 circular PM fiber coupler.

2. The sensor of claim 1, wherein the 3×3 circular PM fiber coupler includes three circular PM fibers, each containing a core and a set of three symmetrically positioned stress elements, and the 3×3 circular PM fiber coupler requires only cores-paralleling regardless of relative orientations of three sets of stress elements, with a structural specification requiring three cores of three circular PM fibers to be so placed that cross-sectional geometry forms a triangle.

3. The sensor of claim 1, wherein the 3×3 circular PM fiber coupler includes three circular PM fibers, each containing a core and a set of three symmetrically positioned stress elements, and the 3×3 circular PM fiber coupler requires only cores-paralleling regardless of relative orientations of the three sets of stress elements, with a structural specification requiring three cores of three circular PM fibers to be so placed that cross-sectional geometry forms a straight line.

4. The sensor of claim 1, wherein the sensing fiber loop made of circular PM fiber is employed to sense a rotational rate of the sensing fiber loop, in which two circular light beams traversing the sensing fiber loop in opposite directions acquire a phase difference due to Sagnac effect that is proportional to the rotational rate of the sensing fiber loop.

5. The sensor of claim 1, wherein the sensing fiber loop made of circular PM fiber is employed to sense an electric current coiled by the sensing fiber loop, in which two circular light beams traversing the sensing fiber loop in opposite directions acquire a phase difference due to Faraday effect that is proportional to ampere-turns of an electric current.

6. A passively biased fiber-optic sensor, comprising:
   a source providing a linear light;
   a 2×2 single-mode fiber coupler with one arm receiving the linear light;
   a 3×3 hybrid fiber coupler connected to an output arm of the 2×2 single-mode fiber coupler via a polarizer, wherein the 3×3 hybrid fiber coupler is made of one single-mode fiber and two linear hi-bi fibers with the two linear hi-bi fibers acting as a beam splitter that splits a received linear light beam into two linear light beams and meanwhile with three fibers together providing a 120° phase relation for passive bias of an interferometric sensor, wherein the 2×2 single-mode fiber coupler is cut short with an oblique angle at ends to form two matched terminations;

a sensing fiber loop whose two terminals are connected to output terminals of the two linear hi-bi fiber of the 3×3 hybrid fiber coupler to receive the two linear light beams traversing the sensing fiber loop in opposite directions; and a detector connected to a second fiber arm of the 2×2 single-mode fiber coupler to detect a signal carried by returned light beams through recombination and interference in a coupling region of a hybrid coupler.

7. The sensor of claim 6, wherein a cross-sectional view of the 3×3 hybrid fiber coupler is a configuration including two linear hi-bi fibers and one single-mode fiber, with cores of the two linear hi-bi fibers and the one single-mode fiber equally spaced so that geometry of three cores of the 3×3 hybrid coupler forms a triangle, of which the single-mode fiber is cut short obliquely at both ends to form two matched terminations.

8. The sensor of claim 6, wherein a cross-sectional view of the 3×3 hybrid fiber coupler is a configuration of the two linear hi-bi fibers and the one single-mode fiber all placed on a same plane so that geometry of three cores of the 3×3 hybrid fiber coupler forms a straight line, with the 2×2 single-mode fiber cut short obliquely at both ends to form two matched terminations.

9. The sensor of claim 6, wherein the sensing fiber loop is made of linear hi-bi fiber to sense a rotational rate of the sensing fiber loop, in which two counter-propagating linear light beams traverse the sensing fiber loop to yield a phase difference due to Sagnac effect that is proportional to the rotational rate of the sensing fiber loop.

10. The sensor of claim 6, wherein the sensing fiber loop is made of circular PM (polarization Maintaining) fiber whose two terminals are connected, via two "fast to zero" fiber-optic wave plates, to terminals of two linear hi-bi fiber arms of the 3×3 hybrid fiber coupler, so that two linear light beams emerging from the 3×3 hybrid fiber coupler are converted to two circular light beams to enter the two terminals of the sensing fiber loop and traverse in opposite directions to acquire a phase difference due to Faraday effect that is proportional to ampere-turns of an electric current coiled by the sensing fiber loop.

* * * * *